(12) United States Patent
Mizuno et al.

(10) Patent No.: US 7,805,264 B2
(45) Date of Patent: Sep. 28, 2010

(54) METHOD OF CALCULATING INTERNAL RESISTANCE OF SECONDARY BATTERY FOR VEHICLE

(75) Inventors: Satoru Mizuno, Okazaki (JP); Shoji Sakai, Toyota (JP); Hiroaki Ono, Tokoname (JP)

(73) Assignees: Nippon Soken, Inc., Nishio (JP); Denso Corporation, Kariya (JP)

( * ) Notice: Subject to any disclaimer, the term of this patent is extended or adjusted under 35 U.S.C. 154(b) by 303 days.

(21) Appl. No.: 12/034,699

(22) Filed: Feb. 21, 2008

(65) Prior Publication Data

US 2008/0215266 A1 Sep. 4, 2008

(30) Foreign Application Priority Data

Mar. 2, 2007 (JP) ............................. 2007-053227

(51) Int. Cl.
*G01R 19/00* (2006.01)
(52) U.S. Cl. ........................................ 702/64; 324/430
(58) Field of Classification Search .................... 702/60, 702/63–66, 179; 320/127, 132, 134, 136–137; 324/427–428, 430
See application file for complete search history.

(56) References Cited

U.S. PATENT DOCUMENTS 6,160,380 A * 12/2000 Tsuji et al. .................. 320/132

2006/0232277 A1 * 10/2006 Murakami et al. .......... 324/433
2009/0128157 A1 * 5/2009 Moriya ....................... 324/426

FOREIGN PATENT DOCUMENTS

| JP | 2002-168929 | 6/2002 |
| JP | 2002-343444 | 11/2002 |
| JP | 2005-146939 | 6/2005 |

* cited by examiner

*Primary Examiner*—Hal D Wachsman
*Assistant Examiner*—Mary C O'Malley
(74) *Attorney, Agent, or Firm*—Nixon & Vanderhye, PC (57) ABSTRACT

A current Ibe and a voltage Vbe before a large current discharge in a secondary battery are stored in a memory. Plural voltage-current pairs are detected and stored in the memory during the large current discharge. Next, a regression curve (or a regression line) is obtained based on the plural voltage-current pairs stored in the memory using a well-known method. A discharge current Ip which exceeds a current-sensor detectable range is input in the regression curve to obtain a voltage Vp. A maximum discharge coordinate is set using the discharge current Ip and the voltage Vp. An internal resistance Rin of the secondary battery is calculated based on an inclination of a line that connects the coordinates (Ibe, Vbe) and (Ip, Vp).

2 Claims, 12 Drawing Sheets

METHOD OF CALCULATING INTERNAL RESISTANCE OF SECONDARY BATTERY FOR VEHICLE

CROSS-REFERENCE TO RELATED APPLICATION

This application is related to and claims priority from Japanese Patent Application No. 2007-53227 filed on Mar. 2, 2007, the contents of which are hereby incorporated by reference.

BACKGROUND OF THE INVENTION

1. Field of the Invention

The present invention relates to an improved method of calculating an internal resistance of a secondary battery (or a storage battery) mounted on a motor vehicle.

2. Description of the Related Art

An internal resistance as one of internal impedances of a secondary battery (or a storage battery) mounted on a motor vehicle is a well-known important parameter in order to judge a deterioration state of and a charge state of the secondary battery, For example, using an internal resistance as an input parameter into a Neural network simulator capable of performing a state of charge (SOC) calculation can detect a SOC of the secondary battery with high accuracy.

Related art techniques calculate such an internal resistance of a secondary battery based on an inclination of a regression line obtained using a current-voltage (I-V) characteristic of the secondary battery. For example, Japanese patent laid open publication No. JP 2002-343444 and No. JP 2005-146939 have disclosed such a method of calculating an internal resistance of a secondary battery based on an inclination of a regression line.

However, because the I-V characteristic of a secondary battery such as a lead storage battery is much changed and a polarization state of the secondary battery is thereby largely varied, it is difficult to obtain the internal resistance based on the I-V characteristic of the secondary battery for a motor vehicle with high accuracy. In order to solve such a drawback, there is another related art technique for calculating an internal resistance of a secondary battery with high accuracy using an I-V characteristic measured at an engine start where a change of a large current occurs in a short period of time. This method is referred to as the "internal resistance calculation method at an engine start".

Such an internal resistance calculation method when a vehicle engine starts is requested to measure a I-V characteristic within a large current range in order to increase the calculation accuracy for the internal resistance of the storage battery.

The internal resistance calculation method further requires a current sensor capable of measuring a large currant within a wide current range with desired high accuracy in order to measure a starting current when a vehicle engine starts within a full detection range such as from −1000 A to −600 A. The current sensor having such a capability is extremely expensive because it guarantees a desired accuracy at any detection point in the full detection range.

Still further, the current sensor having such a function detectable a wide current range is only used when the vehicle engine starts, in other words, is not used in a case other than the vehicle engine start. In addition, because the engine starting current varies from a minimum value to a maximum value for a short period of time, for example, within a short-time range of 1 to 3 msec, it is in general difficult to perform samplings of the engine starting current in a wide range at a high speed with high accuracy.

Figure 11:
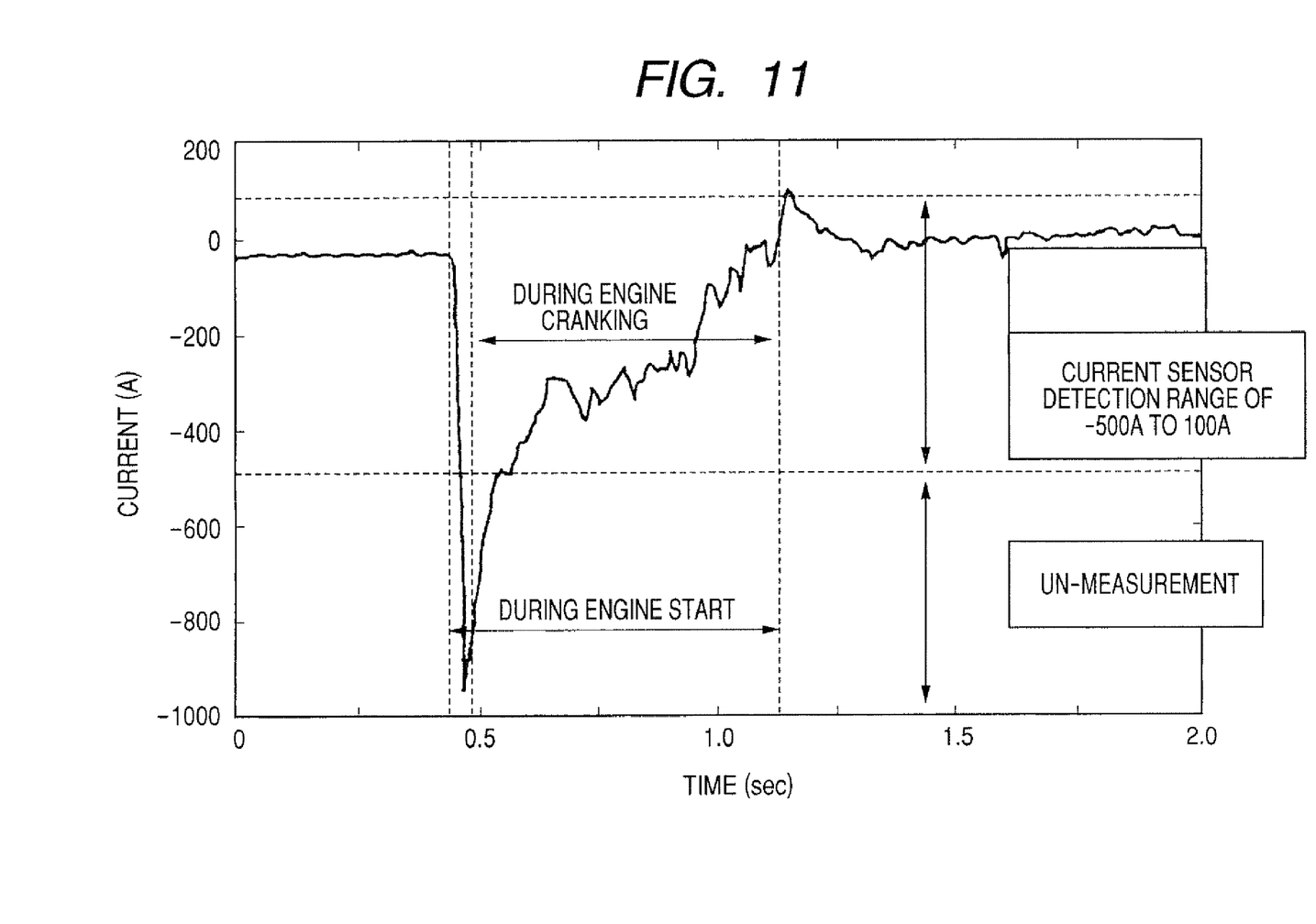
FIG. 11 is a view showing an output waveform of a current sensor when an engine starts.

In order to solve such a related art problem in views of necessity and economical efficiency, the related arts use a current sensor (or a middle range current sensor) capable of measuring a current within a range of −500 A to +100 A in order to measure an engine cranking current. FIG. 11 shows a current waveform when a vehicle engine starts detected by such a middle range current sensor. As clearly understood from FIG. 11, the middle range current sensor cannot detect a discharge current in a wide current range when a vehicle engine starts.

Figure 12:
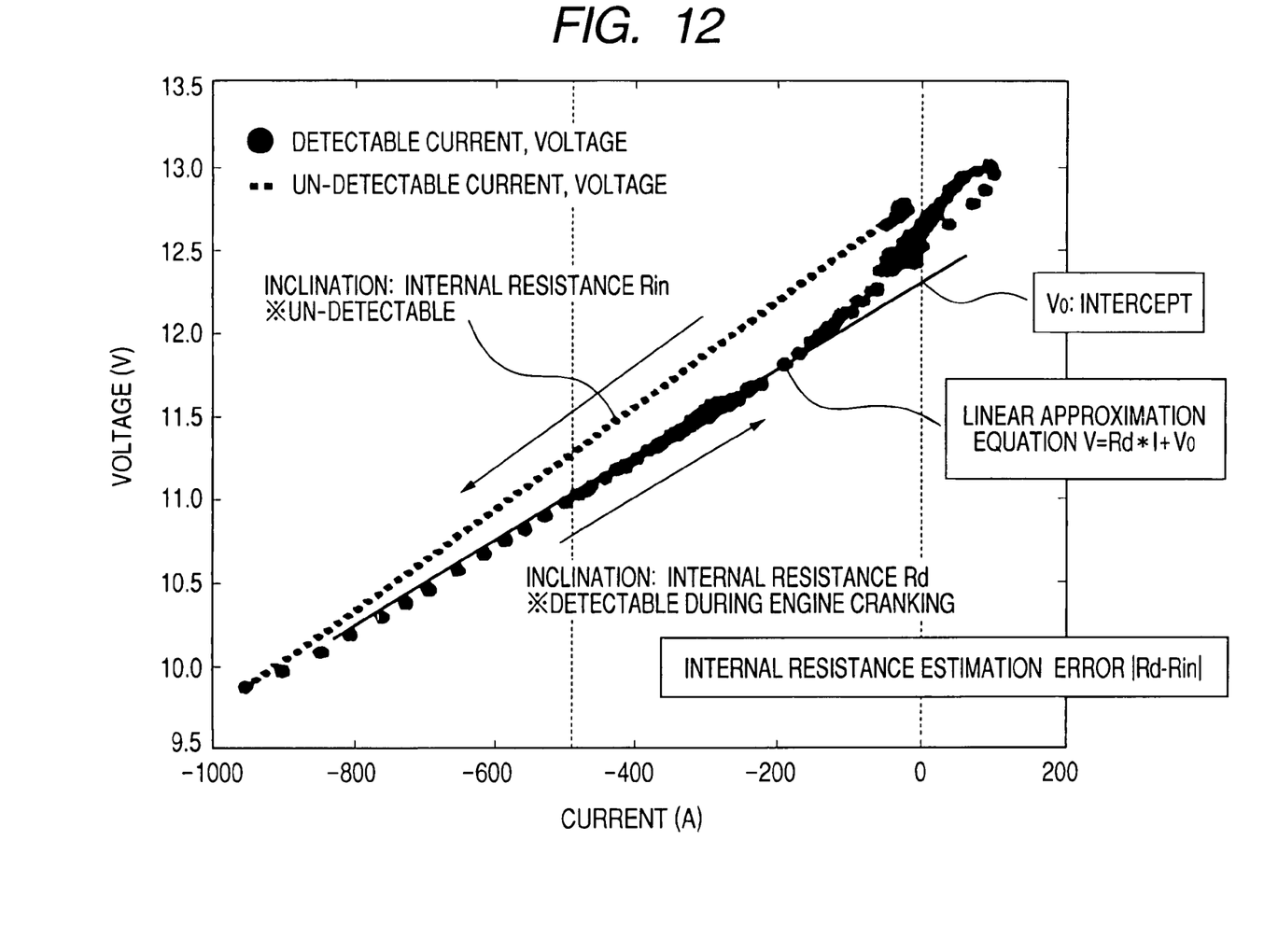
FIG. 12 is a view explaining a problem to cause a large calculation error of an internal resistance of a storage battery (or a secondary battery) when using a current sensor of a narrow detection range in a measurable current.

However, the use of the current-voltage characteristic during a cranking detected by such a middle range current sensor causes a difficulty in detecting an internal resistance of a secondary battery (or a storage battery) with high accuracy because a polarization state of the secondary battery largely affects the detection accuracy of the internal resistance of the secondary battery, as shown in FIG. 12.

SUMMARY OF THE INVENTION

It is an object of the present invention to provide a method of calculating an internal resistance of a secondary battery (or a storage battery) when a vehicle engine starts without using a current sensor capable of detecting a current in a wide range with high accuracy.

To achieve the above purposes, the present invention provides a method of calculating an internal resistance of a secondary battery. In the method, a voltage and a current of a secondary battery are measured when a large current discharge occurs in the secondary battery. A regression characteristic curve is calculated based on the measured voltage and current within a current sensor detectable current range. A maximum discharge coordinate is set on an extended curve which exceeds the detectable current range of the current sensor. This extended curve is extended toward the large current discharge side from the regression characteristic curve. A pre-discharge coordinate is set, which is designated by the measured voltage and current of the secondary battery measured before occurrence of the large current discharge in the secondary battery. An internal resistance of the secondary battery is calculated based on an inclination of a line that connects the maximum discharge coordinate and the pre-discharge coordinate. This regression characteristic curve is a regression curve or a regression line obtained by the least squares method.

According to the present invention, it is possible to calculate the internal resistance of the secondary battery with high accuracy without using any expensive current sensor capable of guaranteeing its detection accuracy within a wide current range.

In the method as another aspect of the present invention, the regression characteristic line is calculated based on voltages and currents which are measured when a vehicle engine starts. It is thereby possible to detect the internal resistance of the secondary battery with high accuracy, which is equals in accuracy to the method of sampling current and voltage data items of the secondary battery within a short length of time where a polarization change occurs in the secondary battery.

In the method as another aspect of the present invention, the maximum discharge coordinate is set approximately corresponding to a coordinate designated by an estimate maximum discharge current and a voltage at the estimate maximum discharge current in the secondary battery when the vehicle engine starts.

Because the magnitude of the maximum discharge current generated in the secondary battery at the start of the vehicle engine is adequately known, although some variation thereof occurs, the method of the present invention can calculate the internal resistance of the secondary battery with high accuracy in actual use.

BRIEF DESCRIPTION OF THE DRAWINGS

A preferred, non-limiting embodiment of the present invention will be described by way of example with reference to the accompanying drawings, in which.

DETAILED DESCRIPTION OF THE PREFERRED EMBODIMENTS

Hereinafter, various embodiments of the present invention will be described with reference to the accompanying drawings. In the following description of the various embodiments, like reference characters or numerals designate like or equivalent component parts throughout the several diagrams.

First Embodiment

A description will be given of an internal state detection device capable of performing a method of calculating an internal resistance of a secondary battery (or a storage battery) mounted on a motor vehicle according to the present invention. The method according to the first embodiment performs a curve approximation using an exponential curve (as a regression characteristic line) for a current-voltage characteristic of the secondary battery.

(Circuit Configuration)

The internal resistance detection device according to the first embodiment capable of detecting an internal state of a storage battery (or a secondary battery) will be explained with reference to FIG. 1.

Figure 1:
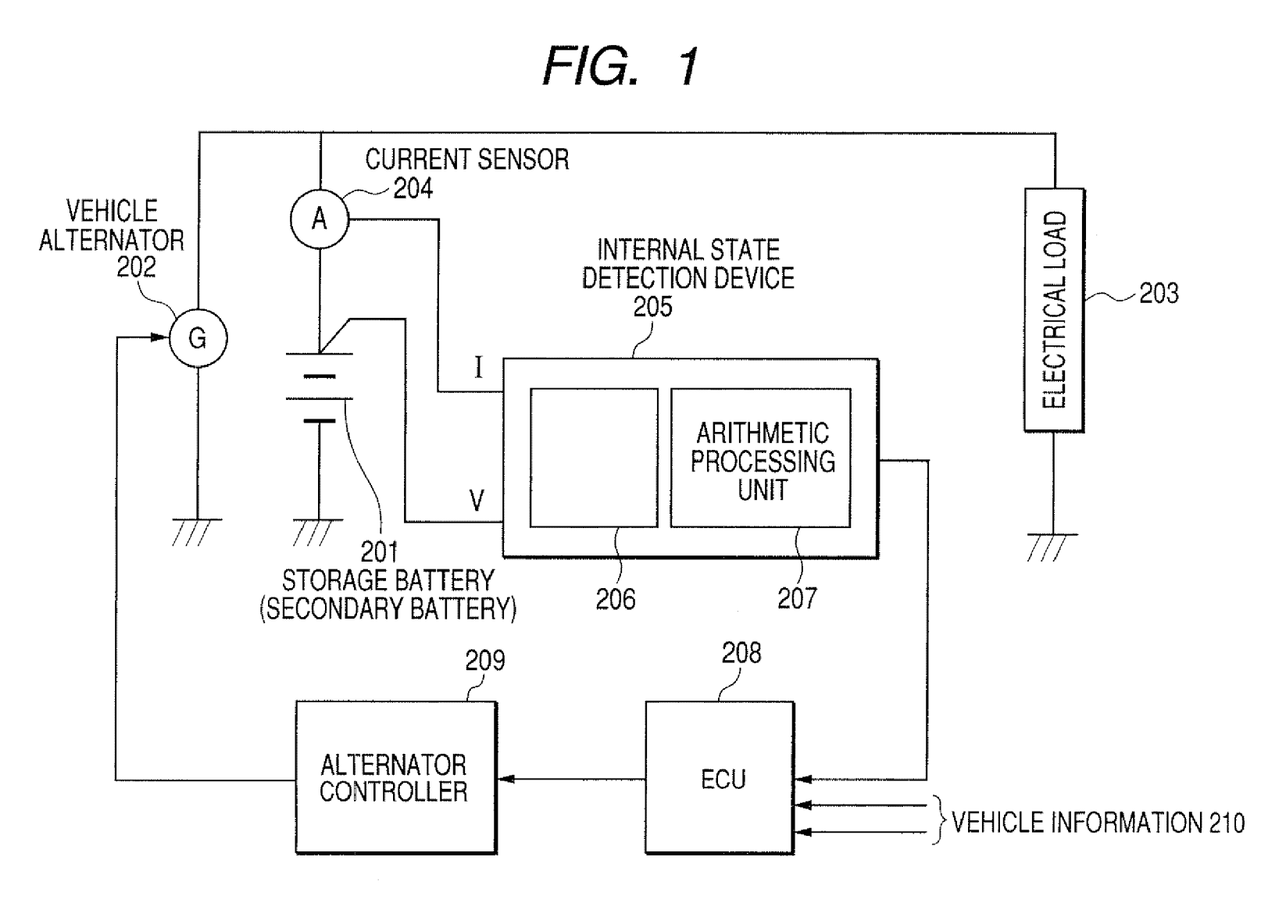
FIG. 1 is a block diagram showing a circuit configuration of an internal state detection device capable of detecting an internal state of a secondary battery (or a storage battery) according to a first embodiment of the present invention.

FIG. 1 is a block diagram mainly showing a circuit configuration of the internal state detection device according to the first embodiment of the present invention. In FIG. 1, reference number 201 designates a storage battery (or a secondary battery) mounted on a motor vehicle, which is a detection target of the internal state detection device. The storage battery 201 is one of a lead storage battery, a nickel-metal hydride battery, a lithium battery, or others. The present invention does not limit a battery type as the detection target of the internal state detection device. In FIG. 1, reference number 202 designates a vehicle alternator which is driven by an internal combustion engine (not shown) mounted on a motor vehicle (not shown). Reference number 203 indicates an electrical load, and 204 designates a current sensor capable of detecting a charging current of and a discharging current of the battery 201. Reference number 205 indicates the internal state detection device capable of detecting an internal state of the storage battery 201 as a secondary battery.

The internal state detection device 205 is comprised of a buffer unit 206 and an arithmetic processing unit 207. The buffer unit 206 reads an output signal transferred from the current sensor 204 and a terminal voltage signal of the storage battery 201. The arithmetic processing unit 207 receives signals which are processed by the buffer unit 206, and then calculates an internal state quantity such as a state of charge (SOC) of the storage battery 201. Reference number 208 indicates an engine control unit (ECU) which receives vehicle information, for example, an output signal transferred from the internal state detection device 205 and various types of detection signals such as an engine state, a vehicle speed, and a rotation speed of the alternator. The ECU 208 then calculates and generates an electrical power generation instruction signal and an electrical power generation control signal based on the vehicle information received, and outputs such an instruction signal and the control signal to an alternator controller 209 (namely, an electrical power generation control device) in order to optimally control the electrical power generation of the vehicle alternator 202.

(Internal State Detection Device 205)

The internal state detection device 205 reads and stores plural voltage-current pairs of the storage battery 201 and stores them therein. The internal state detection device 205 calculates an internal resistance of the storage battery 201 based on the plural voltage-current pairs. The internal state detection device 205 further calculates a SOC (State Of Charge) of the storage battery 201 using other characteristics of the storage battery 201 which are obtained using the calculated internal resistance and each voltage-current pair. Because the calculation of the SOC is not the object of the present invention, further explanation for the SOC calculation is omitted here.

(Procedure of Calculating an Internal Resistance of the Storage Battery 201)

Next, a description will now be given of the method of calculating an internal resistance of the storage battery 201 using the internal state detection device 205 with reference to the flow chart shown in FIG. 2.

Figure 2:
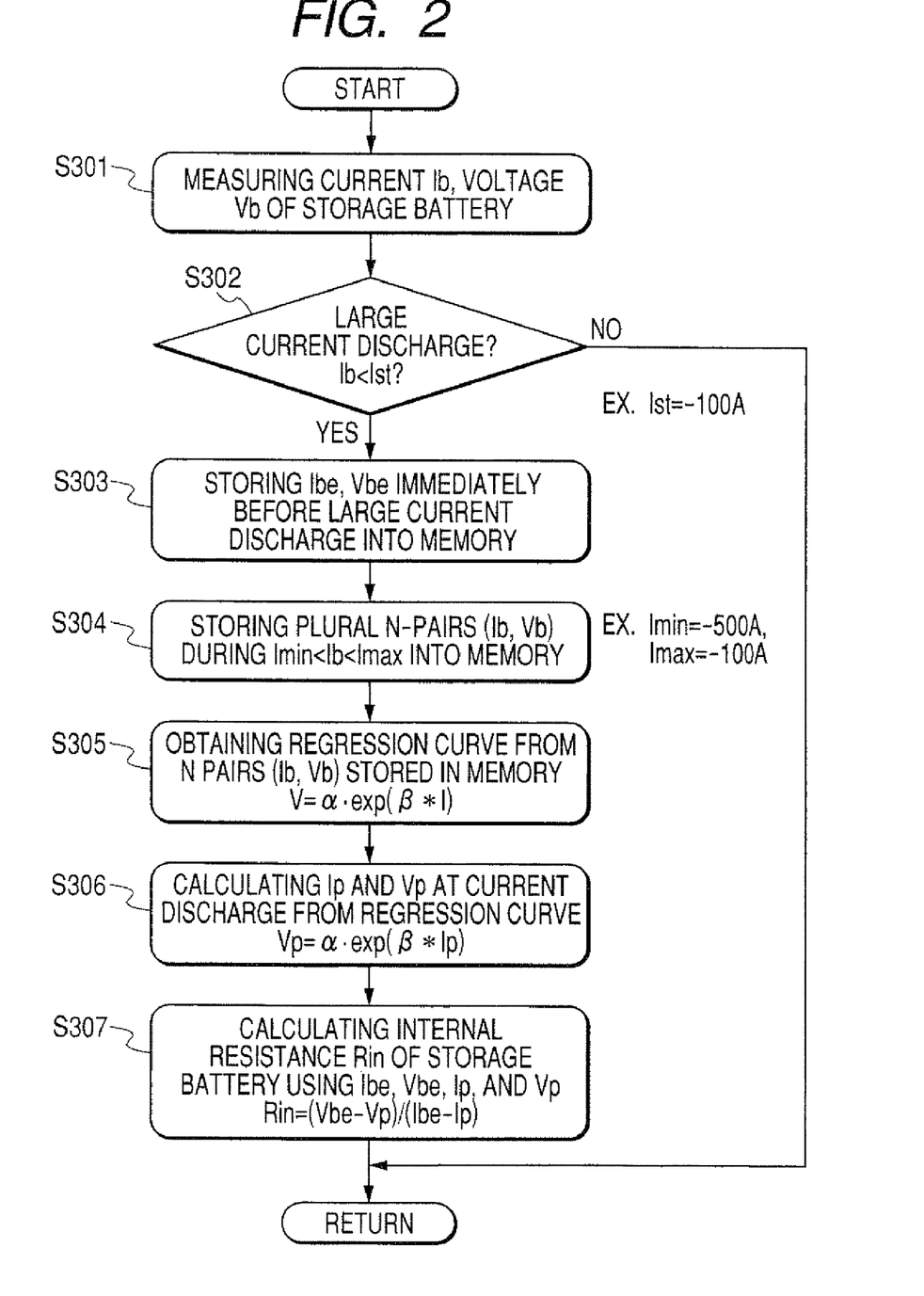
FIG. 2 is a flow chart showing a method of calculating an internal resistance as the internal state of the storage battery according to the first embodiment of the present invention.

FIG. 2 is a flow chart showing the method of calculating an internal resistance of the storage battery 201 using the internal state detection device 205 according to the first embodiment of the present invention.

In the first embodiment, the internal state detection device 205 interrupts the execution of a main program at a constant interval of time in order to regularly execute an interrupt routine from step S301 to step S307 shown in FIG. 2.

The internal state detection device 205 reads a current Ib and a voltage Vb of the storage battery 201 (Step S301) in order to detect whether or not a large current discharge occurs in the storage battery 201 (Step S302).

If any large current discharge does not occur ("no" in Step S302), the operation flow goes to the main program.

If a large current discharge occurs ("yes" in Step S302), a current value Ibe and a voltage value Vbe of the storage battery 201 before the large current discharge occurs are stored in a memory (not shown) as a coordinate point before discharging (Step S303).

Next, a plurality of voltage-current pairs of the storage battery 201 is stored in the memory during a predetermined current detection range, for example, a current detection range of −500 A to −100 A (Imin<Ib<Imax) (Step S304).

Next, in step S305, a regression curve (or a regression line) is obtained as a regression characteristic curve based on the stored plural voltage-current pairs using a well-known method.

The present invention does not limit a kind of an approximation method capable of obtaining a regression curve (or a regression line). The first embodiment of the present invention uses an exponential approximation capable of approximating the current-voltage characteristic when the storage battery discharges with high accuracy.

Step S305 shows such an exponential approximation, where reference characters α and β are constants.

Next, a predetermined discharge current value Ip, which exceeds the detectable current range of the current sensor 204 is input into the exponential approximation as the regression curve in order to calculate the voltage Vp. The discharge current value Ip and the voltage Vp are set as a maximum discharge coordinate.

Following, the current value Ibe and voltage value Vbe, the discharge current Ip and the discharge voltage Vp are input into the following equation (1) in order to calculate an internal resistance Rin of the storage battery 201.

$$Rin=(Vbe-Vp)/(Ibe-Ip) \quad (1).$$

Figure 3:
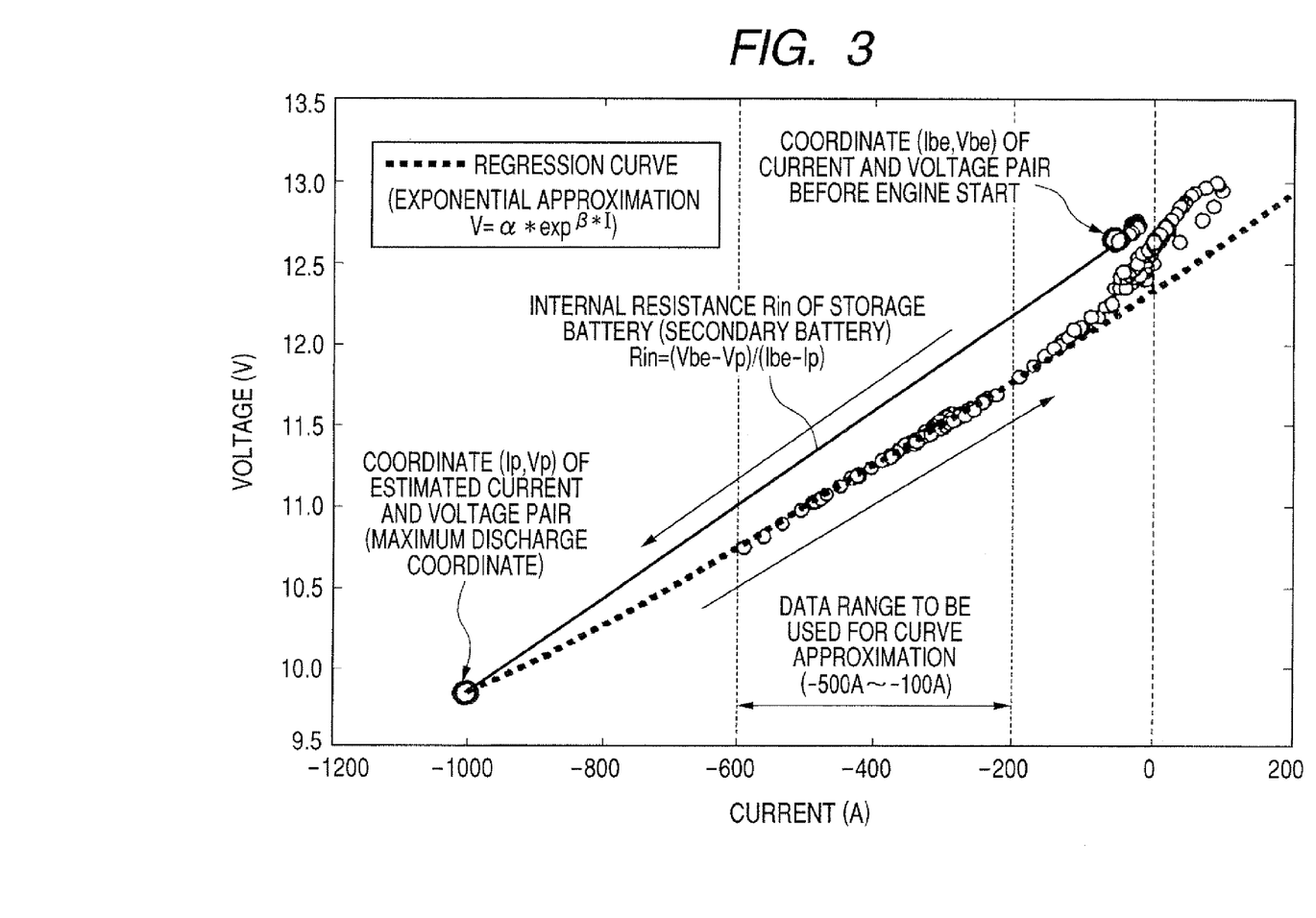
FIG. 3 is an explanatory view showing a calculation procedure of an internal resistance value Rin of the storage battery.

The procedure of calculating the internal resistance Rin is shown in FIG. 3.

FIG. 3 is an explanatory view showing the procedure of calculating the internal resistance value Rin of the storage battery 201.

The internal resistance Rin calculated by the method of the first embodiment has an inclination of the regression curve which is different from the inclination of a regression curve obtained using the voltage-current pairs in the detectable current range of the related art current sensor.

The reason why such a difference occurs is that the regression curve obtained by the related art technique using the voltage-current pair measured within the current sensor detectable range has a trend to a small inclination in views of the influence of a polarization and an ionic feed delay.

On the contrary, the method of the first embodiment can eliminate the influence of a polarization and an ionic feed delay.

(Primary Effect)

Following Table 1 shows the experimental results obtained after a larger current discharge in five types of storage batteries A, B, C, D, and E. The internal resistances Rin was estimated three times per storage battery.

TABLE 1

| Battery | Full charge capacity [Ah] |
|---|---|
| Battery A | 40.7/55(*) |
| Battery B | 25.5/55(*) |
| Battery C | 14.9/52(*) |
| Battery D | 13.3/48(*) |
| Battery E | 16.4/48(*) |

(*)Rated capacity

Figure 4:
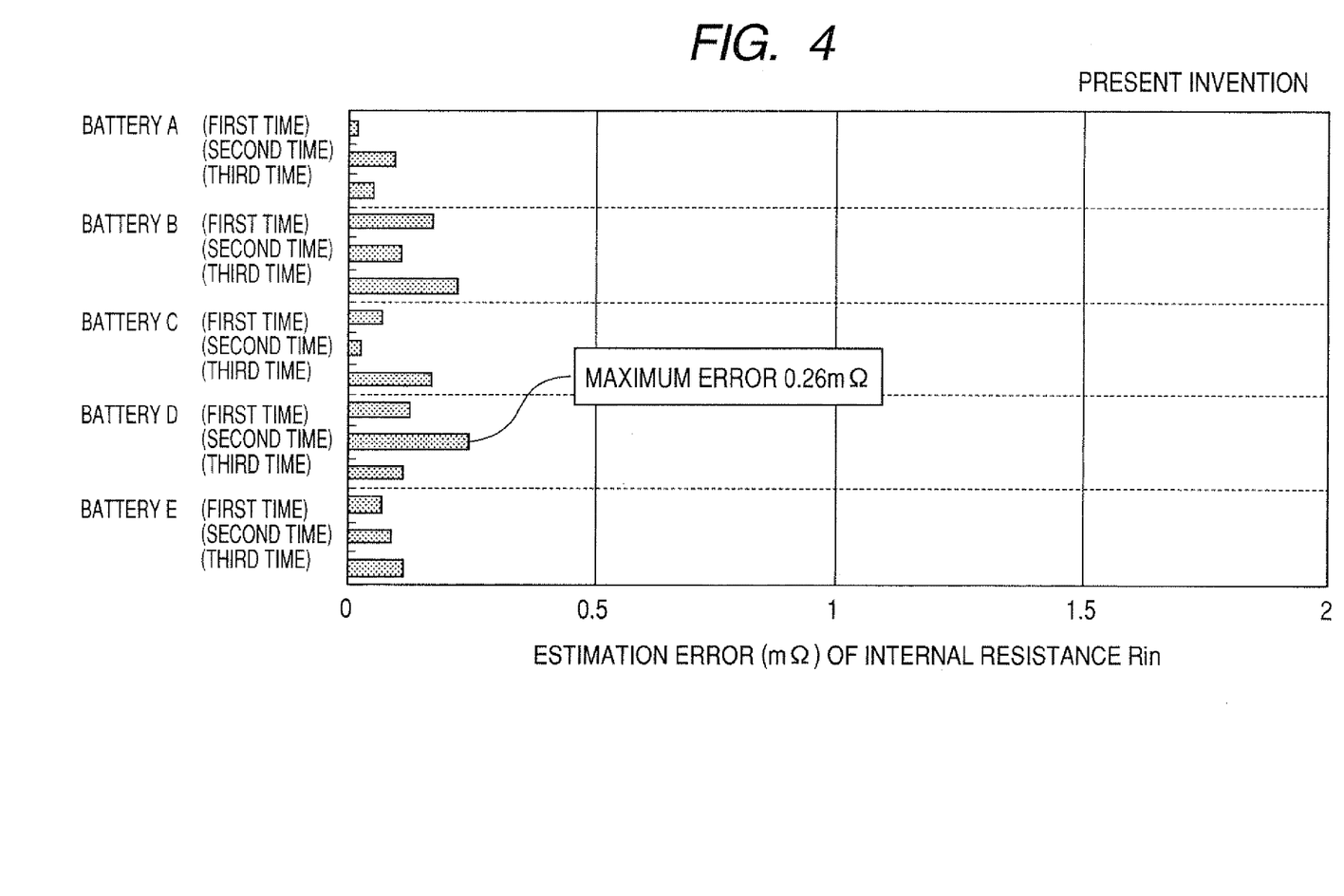
FIG. 4 shows an estimated error of each storage battery, which is an absolute value of a difference between a real value of an internal resistance and the internal resistance obtained by the method according to the first embodiment.

FIG. 4 shows an estimation error of each storage battery, which is an absolute value of a difference between an internal resistance value Rin and a real value of the internal resistance value Rin obtained by the method of the first embodiment. As shown in FIG. 4, the maximum error is 0.25 mΩ.

Figure 5:
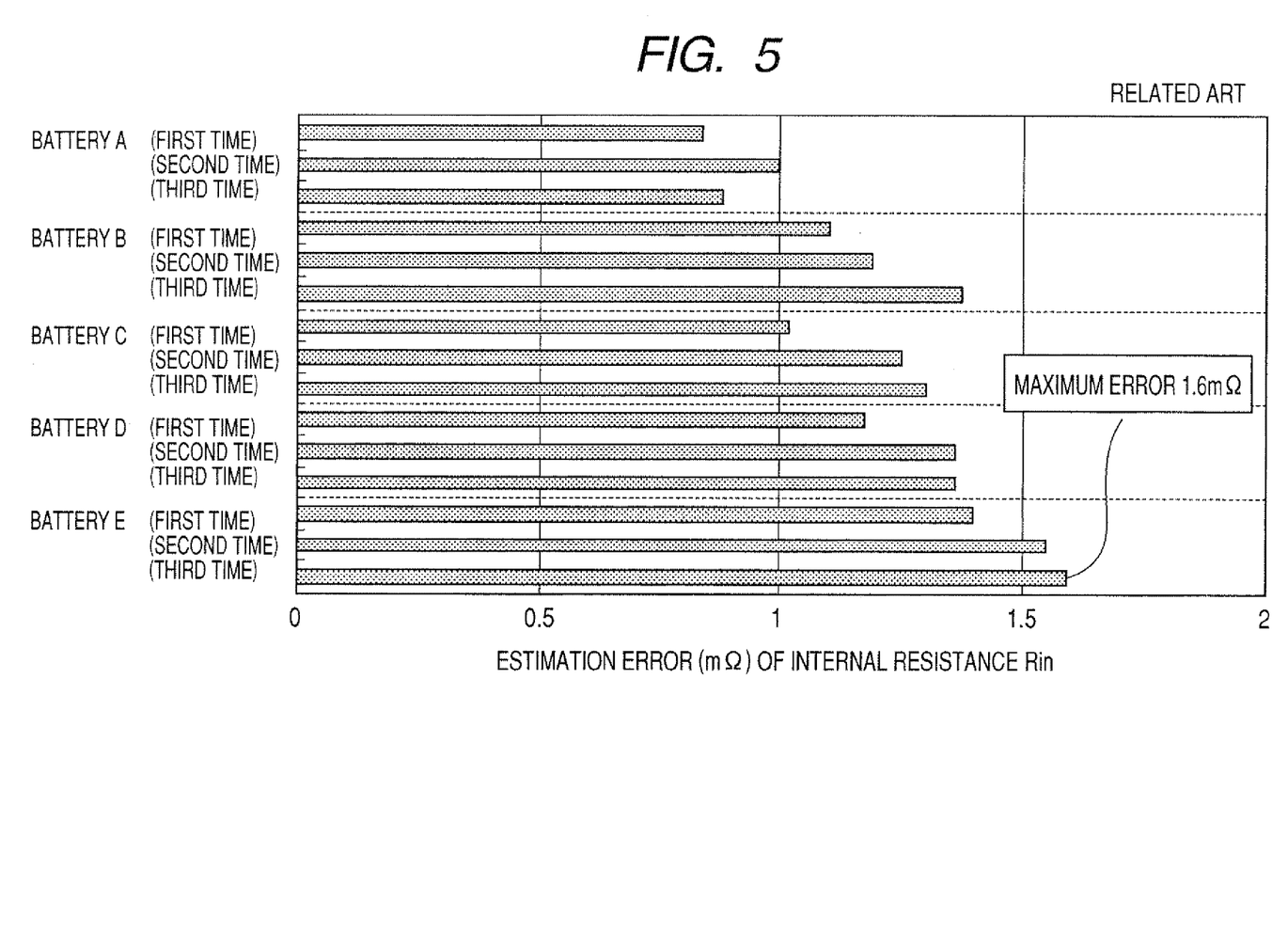
FIG. 5 is a view showing an estimated error of each storage battery, which is an absolute value of a difference between a real value of an internal resistance and the internal resistance obtained by the related art method.

FIG. 5 is a view showing an estimated error of each storage battery which is an absolute value of a difference between a real value of an internal resistance value Rin and the internal resistance value Rin obtained by the related art method. The related art method used a linear approximation for discharge current Ib and discharge voltage Vb obtained at plural points measured during the cranking and detected the internal resistance Rd using the inclination of the linear approximation. The polarization and the like affect the internal resistance Rd of the storage battery during the cranking.

Similarly, the maximum absolute value of the estimated error such as a difference between Rd and Rin is 1.6 mΩ. As a result, it is apparent that the internal resistance calculation method according to the first embodiment of the present invention can drastically decrease the amount of such an estimated error of the internal resistance of the storage battery.

(Secondary Effect)

A description will now be given of the estimation of a lower limit voltage of the storage battery using the internal resistance Rin detected by the method of the first embodiment at a following engine start (namely, when the engine re-starts).

It is very important to obtain an estimated lower limit voltage of the storage battery 201 when the engine starts or re-starts in order to guarantee a possibility of supplying an adequate electric power by the storage battery 201 to a starter for the vehicle engine after the engine stops in an idling stop running which automatically and repeatedly stops and re-starts the vehicle engine. In the first embodiment, the lower limit voltage of the storage battery for a following engine start is estimated based on the detected internal resistance value Rin.

The estimation procedure of the lower limit voltage of the storage battery will now be explained with reference to FIG. 6.

Figure 6:
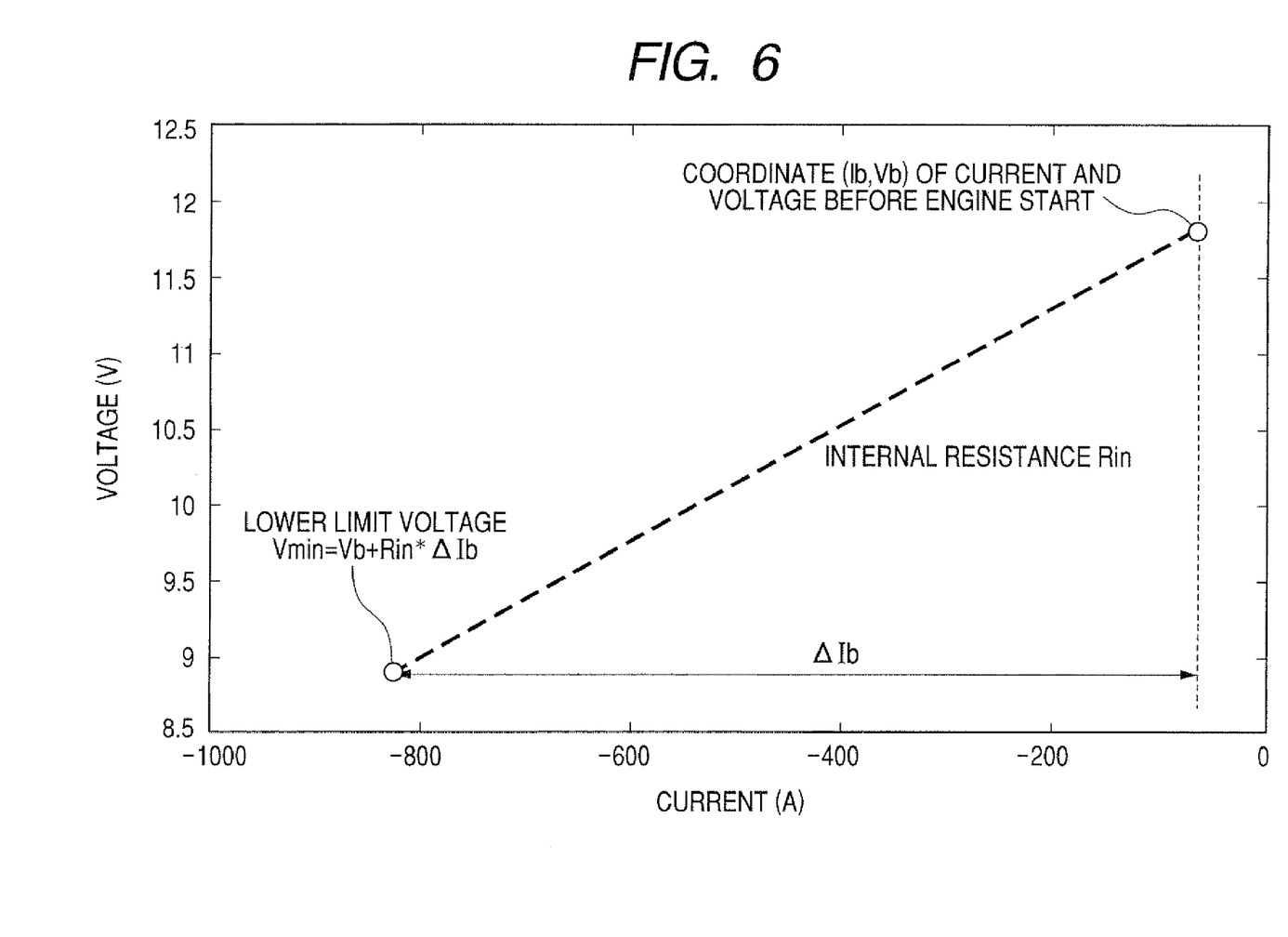
FIG. 6 is an explanatory view showing an estimation procedure of a lower limit voltage.

FIG. 6 is an explanatory view showing the estimation procedure of the lower limit voltage of the storage battery 201.

The lower limit voltage Vmin of the storage battery can be estimated by the following equation (2) using the current Ibe and the voltage Vbe before the engine starts, and the internal resistance Rin calculated just before the time.

$$Vmin=Vbe+Rin \cdot \Delta Ib \quad (2)$$

where ΔIb is a variation of a current value of the storage battery from a current value before the engine starts.

Figure 7:
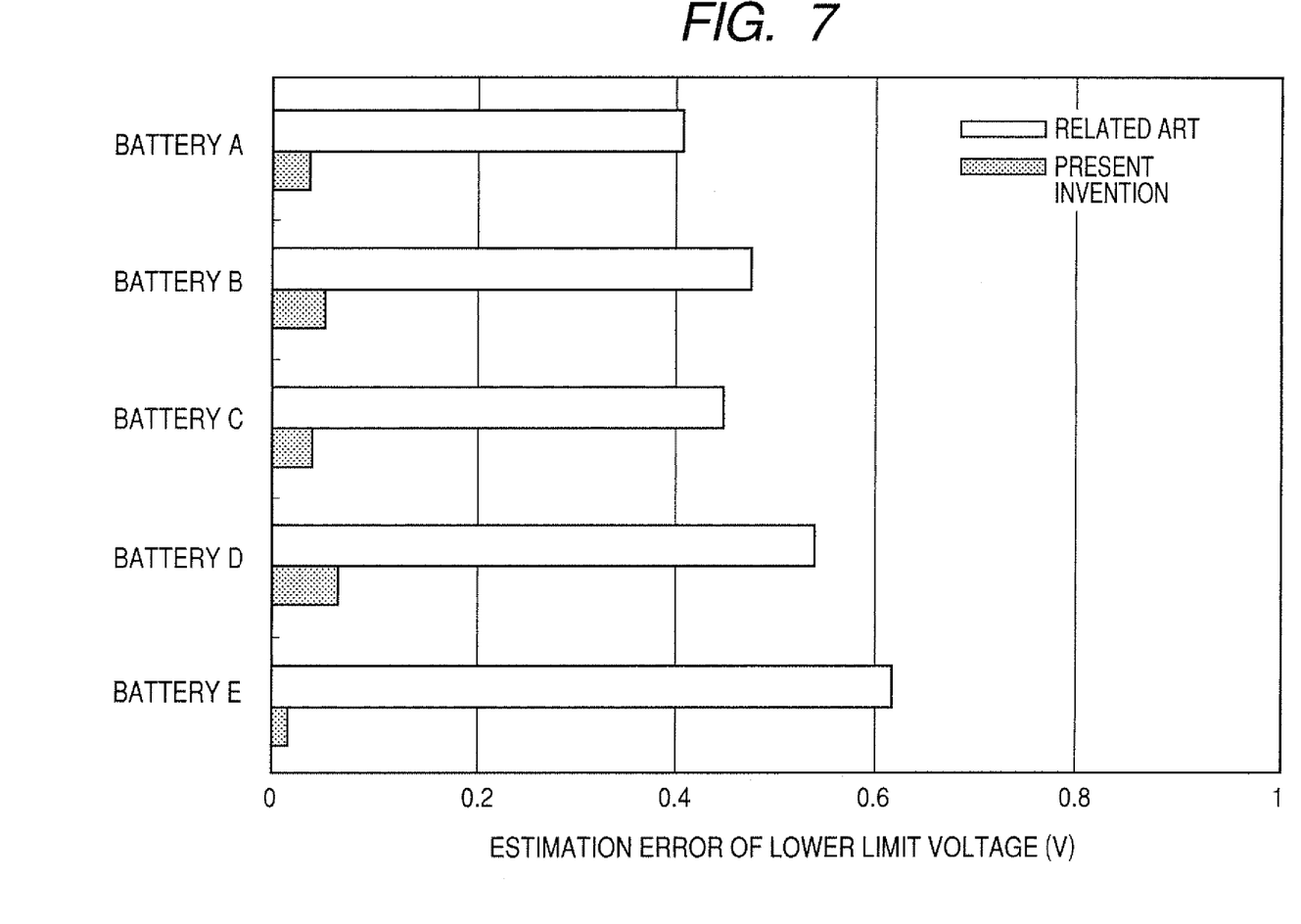
FIG. 7 is an explanatory view showing estimation errors of the lower limit voltage in each storage battery obtained by the methods of the present invention and the related art.

FIG. 7 is an explanatory view showing estimation errors of the lower limit voltage in each of the storage batteries A, B, C, D, and E obtained by the methods of present invention and the related art. In FIG. 7, the estimation errors of the lower limit voltage in each of the storage batteries A, B, C, D, and E were obtained using the internal resistance Rd obtained by the related art method.

As clearly understood from FIG. 7, for example, in the storage battery E, the magnitude of the estimation error is drastically decreased from 0.62V (related art) to 0.06V (Present invention). It is therefore possible that the method of the first embodiment of the present invention can estimate a lower limit voltage of the storage battery with high accuracy.

Second Embodiment

A description will be given of the method of calculating the internal resistance of the storage battery based on a linear approximation using a straight line (as the regression characteristic line) for the current-voltage characteristic of the secondary battery 201 instead of the method of the first embodiment which performs the curve approximation using an exponential curve (as the regression characteristic line) for the current-voltage characteristic of the secondary battery 201.

Figure 8:
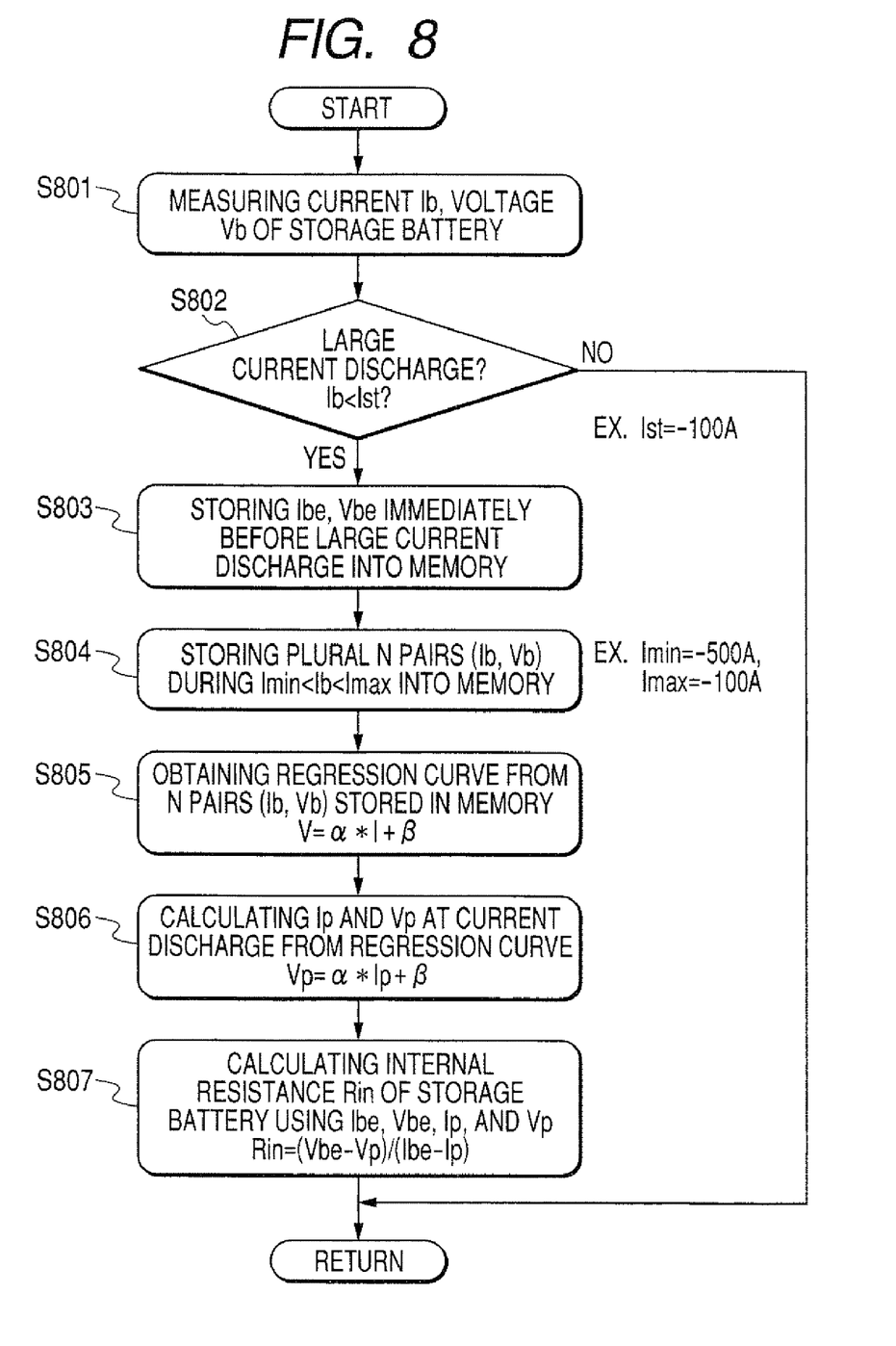
FIG. 8 is a flow chart showing a method of calculating an internal resistance of a storage battery (or a secondary battery) according to a second embodiment of the present invention.

FIG. 8 is a flow chart showing the method of calculating the internal resistance of the storage battery according to the second embodiment of the present invention. The internal resistance calculation procedure of the method according to the second embodiment will be explained with reference to the flow chart shown in FIG. 8.

First, the current Ib and the voltage Vb of the storage battery are measured (Step S801). That is, the internal state detection device 205 measures the current Ib and the voltage Vb of the storage battery 201 using the current sensor 204 and an voltage sensor (omitted from FIG. 1). When the internal state detection device 205 detects that a large amount of current discharge occurs in the storage battery 201 (Step S802), the current Ibe and the voltage Vbe before the occurrence of a large amount of current discharge are stored in the memory (not shown) of the internal state detection device 205 (Step S803).

Next, plural current (Ib) and voltage (Vb) pairs are measured during a predetermined detectable current range (for example, within a range of −500 A to −100 A) in the discharging, and the detected current (Ib) and voltage (Vb) pairs are stored in the memory (not shown) (Step S804).

Next, a regression line (as a regression characteristic curve) is calculated using the current and voltage pairs stored in the memory (step S805) by a following equation (3).

$$V = \alpha I + \beta \, (\alpha, \beta \text{ are constant values}) \quad (3).$$

Next, a voltage value corresponding to the discharge current at a coordinate, which is greater than the detectable current range of the current sensor 204 (as the current sensor detectable current range), is estimated using the approximation line representing the regression line (Step S806). That is, the internal resistance of the storage battery is calculated by inputting the current Ibe and the voltage Vbe before the occurrence of the large current discharge into a following equation (4) (Step S807).

$$Rin = (Vbe - Vp)/(Ibe - Ip) \quad (4).$$

Figure 9:
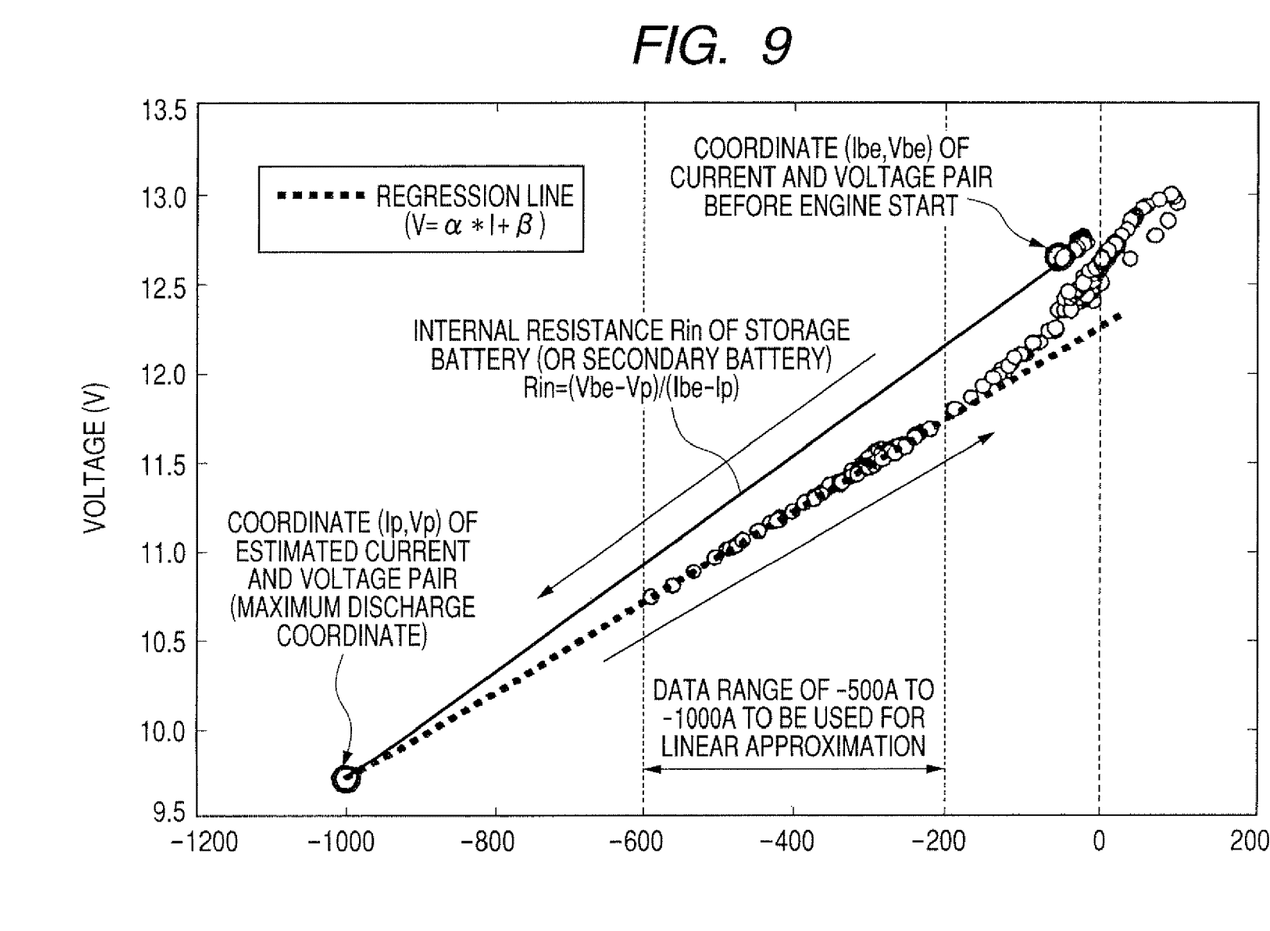
FIG. 9 is an explanatory view showing a calculation procedure of calculating the internal resistance of the storage battery according to the second embodiment of the present invention.

FIG. 9 is an explanatory view showing the calculation procedure in the method of the second embodiment capable of calculating the internal resistance value Rin of the storage battery.

When the discharge current is Ip, a inclination of the line between the coordinate (Ip, Vp) and the coordinate (Ibe, Vbe) is obtained as the internal resistance of the storage battery, where the coordinate (Ip, Vp) is estimated based on the discharge current Ip and the voltage Vp, and the coordinate (Ibe, Vbe) corresponding to the current Ibe and the voltage Vbe before the large current discharge.

(Effect)

The internal resistances Rin were estimated three times per storage battery after a large current discharge was carried out three times per each of the five batteries A, B, C, D, and E shown in Table 1.

Figure 10:
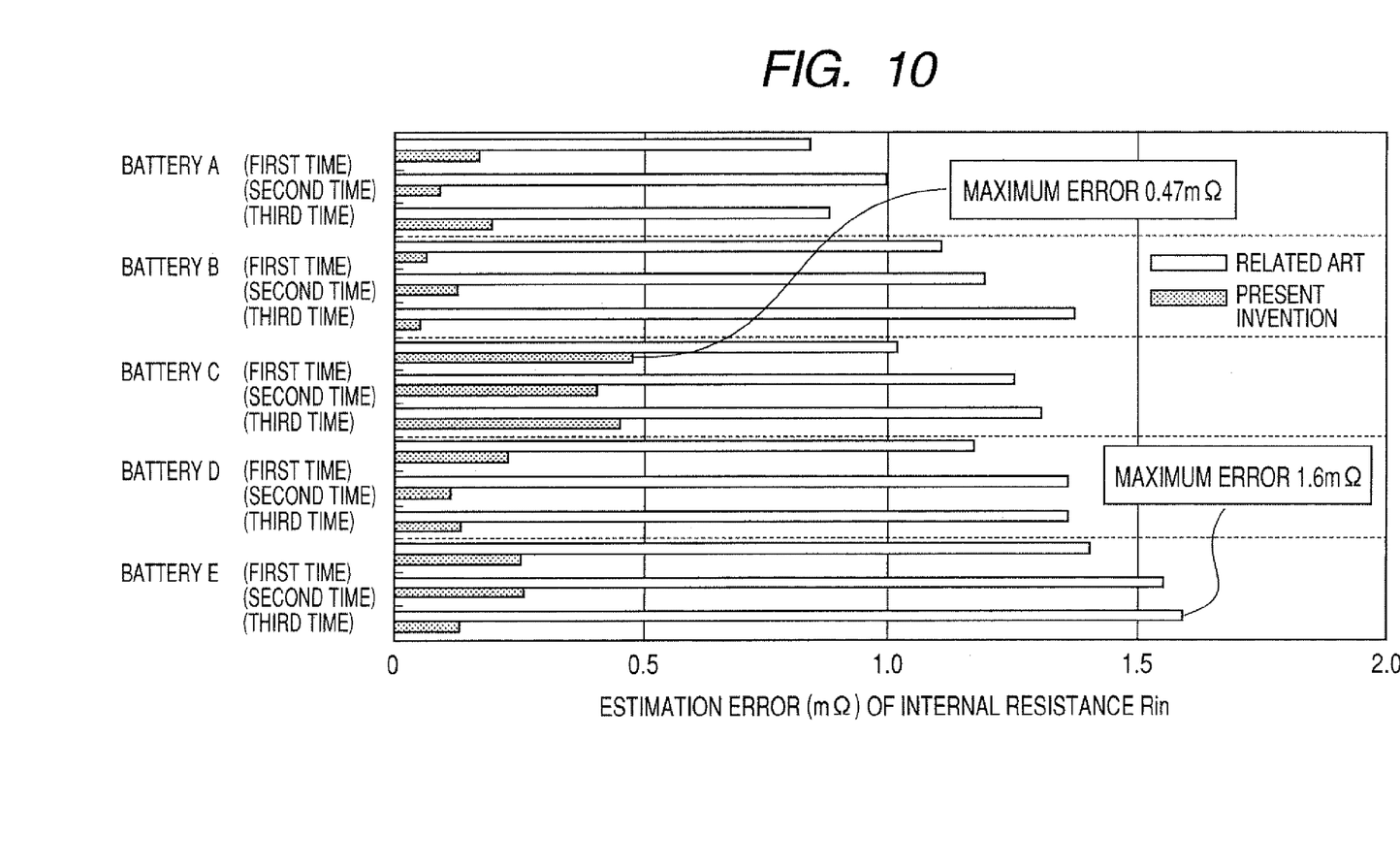
FIG. 10 shows estimated errors of each storage battery obtained by the method according to the second embodiment of the present invention and by the method of the related art.

FIG. 10 shows estimated errors of each storage battery obtained by the method of the second embodiment of the present invention and by the method of the related art.

As shown in FIG. 10, the method of the second embodiment has a maximum estimation error of 0.47 mΩ. On the contrary, the method of the related art has a maximum estimation error of 1.6 mΩ which is approximately four times of that of the second embodiment.

Therefore it is possible for the method according to the present invention to detect the internal resistance of the storage battery with high accuracy even if the method uses the linear approximation instead of the curve approximation (namely the exponential approximation) when compared with the method of the related art.

While specific embodiments of the present invention have been described in detail, it will be appreciated by those skilled in the art that various modifications and alternatives to those details could be developed in light of the overall teachings of the disclosure. Accordingly, the particular arrangements disclosed are meant to be illustrative only and not limited to the scope of the present invention which is to be given the full breadth of the following claims and all equivalent thereof.

What is claimed is:

1. A method of calculating an internal resistance of a secondary battery mounted on a vehicle, comprising steps of:

detecting a current of a secondary battery by a current sensor, and a voltage of the secondary battery by an internal state detection device when a large current discharge occurs in the secondary battery, and the detected voltage and current of the secondary battery are stored into a buffer unit in the internal state detection device;

calculating a regression characteristic curve by an arithmetic processing unit in the internal state detection device based on the detected voltage and current, stored in the buffer unit, within a detectable current range of the current sensor;

setting a maximum discharge coordinate, by the arithmetic processing unit, on an extended curve extended from the regression characteristic curve toward the large current discharge side which is greater than the detectable current range of the current sensor;

setting a pre-discharge coordinate, by the arithmetic processing unit, designated by the detected voltage and current of the secondary battery detected before the secondary battery discharges the large current; and calculating an internal resistance of the secondary battery by the arithmetic processing unit based on an inclination of a line which connects the maximum discharge coordinate and the pre-discharge coordinate, wherein the maximum discharge coordinate is set by the arithmetic processing unit, which approximately corresponds to a coordinate designated by an estimate maximum discharge current and a voltage at the estimated maximum discharge current of the secondary battery when the vehicle engine starts.

2. The method of calculating an internal resistance of a secondary battery according to claim 1, wherein the regression characteristic line is calculated by the arithmetic processing unit based on a voltage and a current detected when the vehicle engine starts.

* * * * *